United States Patent [19]
Minger et al.

[11] Patent Number: 5,576,695
[45] Date of Patent: Nov. 19, 1996

[54] RESISTANCE-MEASUREMENT BASED ARRANGEMENT FOR MONITORING INTEGRITY OF TRAVEL PATH GROUND LINK IN ELECTRONIC COMPONENTS HANDLING APPARATUS

[75] Inventors: William O. Minger; Michael G. Lewis; Kevin B. Kincaid, all of Palm Bay, Fla.

[73] Assignee: Harris Corporation, Melbourne, Fla.

[21] Appl. No.: 135,092

[22] Filed: Oct. 12, 1993

[51] Int. Cl.⁶ .................................................. G08B 21/00
[52] U.S. Cl. .......................... 340/649; 340/673; 340/676; 198/358; 209/573
[58] Field of Search .................................. 340/635, 649, 340/673, 674, 675, 676; 198/358; 209/571, 573, 574

[56] References Cited

U.S. PATENT DOCUMENTS

| | | | |
|---|---|---|---|
| 3,878,933 | 4/1975 | Bauer et al. | 340/674 |
| 3,922,661 | 11/1975 | Enabnit et al. | 340/676 |
| 4,437,563 | 3/1984 | Oriol | 198/810 |
| 5,348,164 | 9/1994 | Heppler | 209/573 |

*Primary Examiner*—John K. Peng
*Assistant Examiner*—Daniel J. Wu
*Attorney, Agent, or Firm*—Charles E. Wands

[57] ABSTRACT

Ground anomalies in electronic circuit component test equipment are identified by a circuit arrangement which continuously monitors the integrity of a ground potential connection to the travel path, and provides both a visual display and an audible alarm in the event of a prescribed degradation in ground potential at any of a plurality of monitored locations along the travel path. A resistance monitoring circuit contains a plurality of voltage dividers that are coupled to respective ones of plural locations along the part's travel path through the handler. Each voltage divider monitors the effective resistance to ground at a respective location within the handler. A scanner unit sequentially couples the voltage divider outputs to a comparator. If the output of a respective voltage divider indicates an effective resistance in excess of the prescribed reference value, a 'ground anomaly' signal is generated, which causes an audible alarm to be generated by an attendant audible alarm unit, thereby alerting processing personnel of the need to take the parts handler out of service for repair/corrective action. In order to locate where, along the travel path within in the handler, the defect has been detected, the resistance monitoring circuit further includes first and second sets of red and green indicator lights. The output of the comparator unit is used to control the illumination of each red and green light pair in dependence upon the output of their associated resistance measurement device.

17 Claims, 3 Drawing Sheets

5,576,695

RESISTANCE-MEASUREMENT BASED ARRANGEMENT FOR MONITORING INTEGRITY OF TRAVEL PATH GROUND LINK IN ELECTRONIC COMPONENTS HANDLING APPARATUS

FIELD OF THE INVENTION

The present invention relates in general to electronic circuit component test equipment, and is particularly directed to an arrangement for monitoring the integrity of a ground potential connection to the travel path of electronic circuit components through a test and measurement apparatus.

BACKGROUND OF THE INVENTION

In order to minimize, and hopefully prevent, the occurrence of a potentially damaging electrostatic discharge between an electronic circuit component and various contact locations along its travel path through a component handling (test) apparatus, it is customary practice to provide ground connections to all parts of the apparatus that make direct contact with the part. Such ground connections are diagrammatically illustrated in FIG. 1 as comprising one or more conductive straps or cables 11 that physically and electrically join various locations 12 along the travel path 13 of parts 14 through the handler 15 and a relatively 'robust' ground reference, such as the metallic framework 16 of the handler. The handler itself may also be externally connected to earth ground 17 in order to ensure proper grounding of its internal framework.

Unfortunately, even with the provision of such grounding connections, over time, physical motion and vibration that occur during the use of the parts handler can be expected to impact the integrity of the ground at one or more locations along the travel path. One way to address this problem would be to periodically (e.g. daily) open up the handler so as to gain access to and manually check the entirety of the part travel path for grounding anomalies. However, even with this approach, should the ground then degrade, the earliest the problem might be discovered would not be until the next check interval (e.g. the next day). In the meantime, all parts processed by the handler during the previous day would be suspect as potentially defective.

SUMMARY OF THE INVENTION

In accordance with the present invention, the above-described grounding anomaly problem that exists in electronic circuit component test equipment is successfully addressed by a circuit arrangement which effectively continuously monitors the integrity of a ground potential connection to the travel path, and provides an output signal (both a visual display and an audible alarm) in the event of a prescribed degradation in ground potential at any of a plurality of monitored locations along the travel path.

For this purpose, the present invention is comprised of a resistance monitoring circuit arrangement that contains a plurality of resistance measurement devices that are coupled to respective ones of plural locations along the part's travel path through the handler. Each resistance monitoring circuit is operative to monitor the effective resistance to ground at a respective location within the handler. A scanner unit is operative to sequentially couple the resistance measurement devices to a comparator unit, so that the comparator unit may sequentially compare outputs of the resistance measurement devices with a prescribed reference resistance value (e.g. twenty ohms). If the output of a respective resistance measurement device indicates an effective resistance in excess of the prescribed reference value, a 'ground anomaly' signal is generated, which causes an audible alarm to be generated by an attendant audible alarm unit, thereby alerting processing personnel of the need to take the parts handler out of service for repair/corrective action.

In order to facilitate locating where, along the travel path within in the handler, the defect has been detected, the resistance monitoring circuit arrangement of the present invention further includes first and second pluralities of indicator lights (e.g. red and green lights), respective ones of which are associated with the plural locations along the travel path. The output of the comparator unit is used to control the illumination of each red and green light pair in dependence upon the output of their associated resistance measurement device as follows.

For a respective measurement location, the comparator is operative to cause an associated red light to be turned on (and maintained on until reset) in response to the output of the associated measurement device being representative of a resistance in excess of the reference resistance value. The illumination of a respective red light provide a steady state indication to service personnel of the location of the ground fault. If, on the other hand, ground integrity is intact, the output of the comparator is operative to cause the associated green light to turn on briefly (the turn-on interval being governed by the scan interval). Whenever a scanned location shows that its resistance is within tolerance, the turn-on of the green indicator light is also used to inhibit the turn-on of its associated red light.

DETAILED DESCRIPTION

Figure 1:
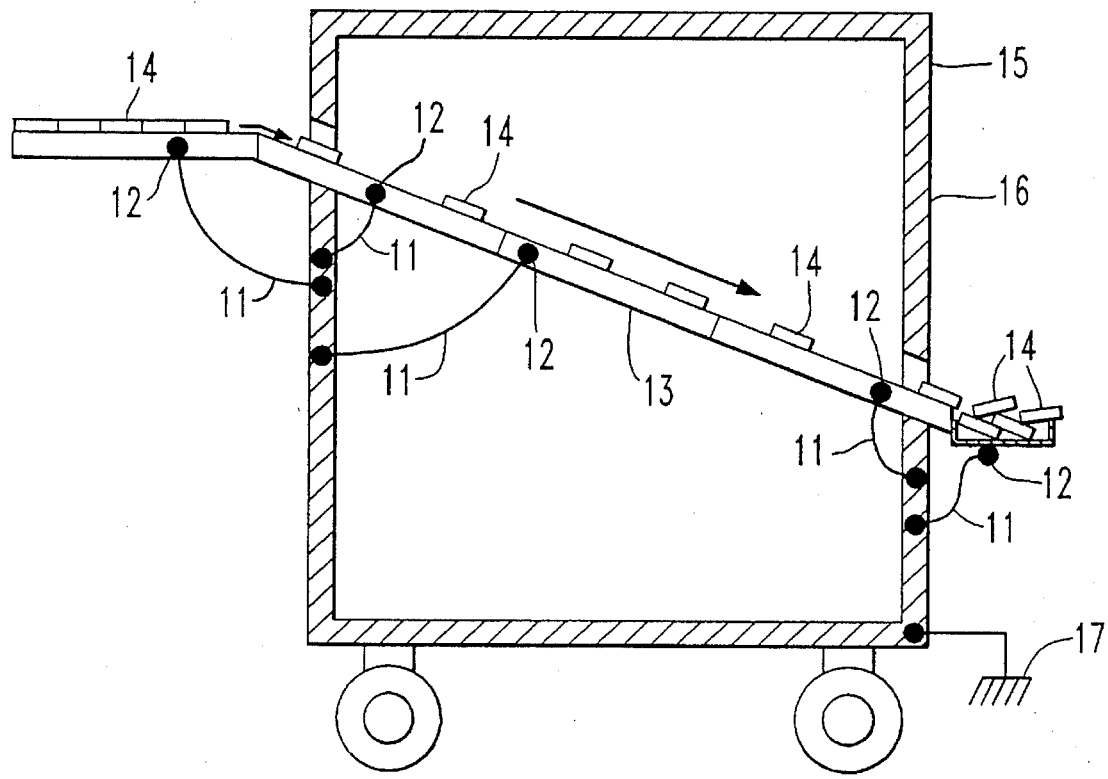
FIG. 1 diagrammatically illustrates an electronic component handler which contains one or more conductive straps that physically and electrically join various locations along a travel path parts through the handler and a relatively 'robust' ground reference.
Figure 2:
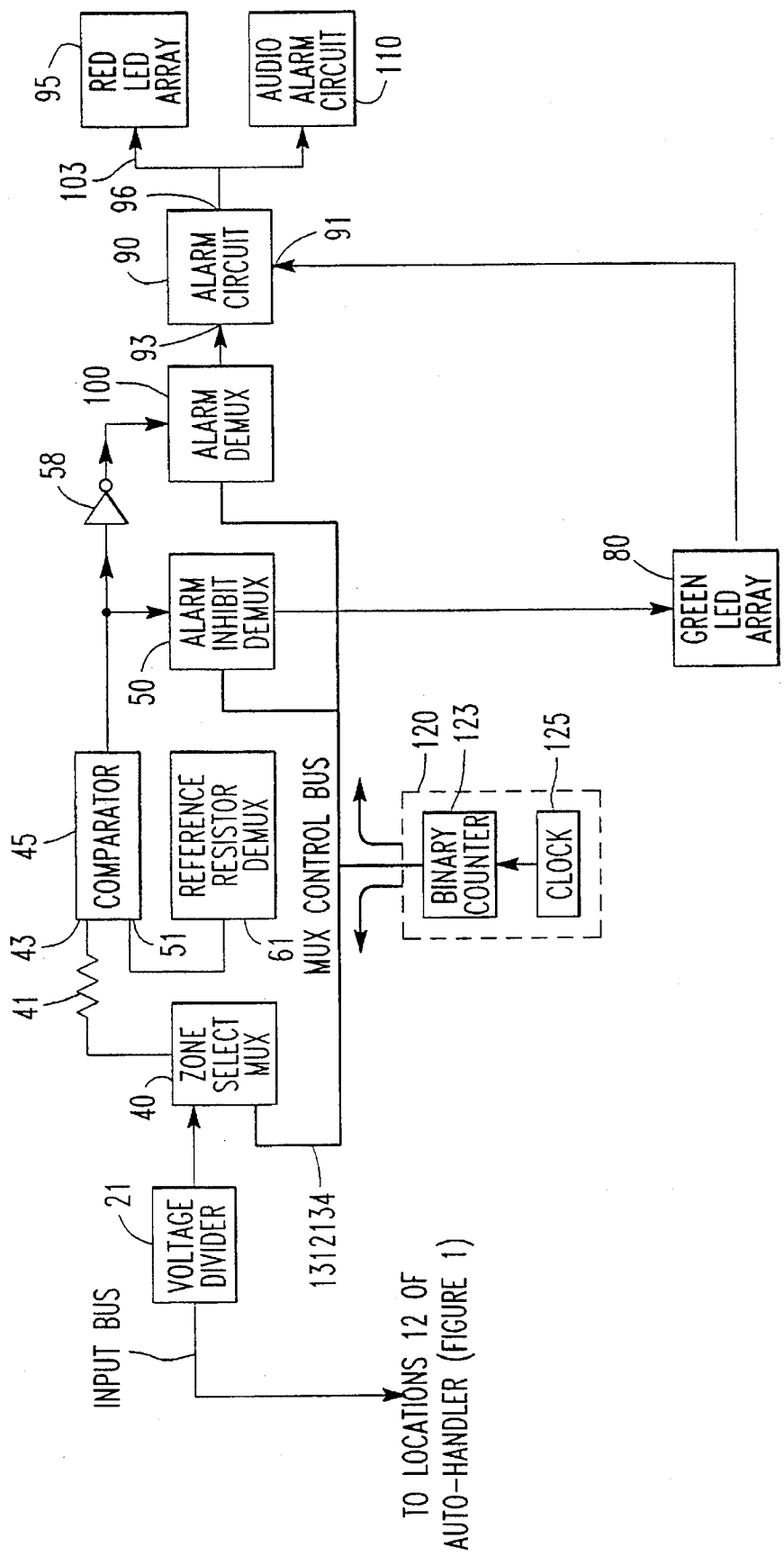
FIGS. 2 and 3 show, respectively, a block diagram and a more detailed circuit diagram of the resistance monitoring circuit arrangement of the present invention.
Figure 3:
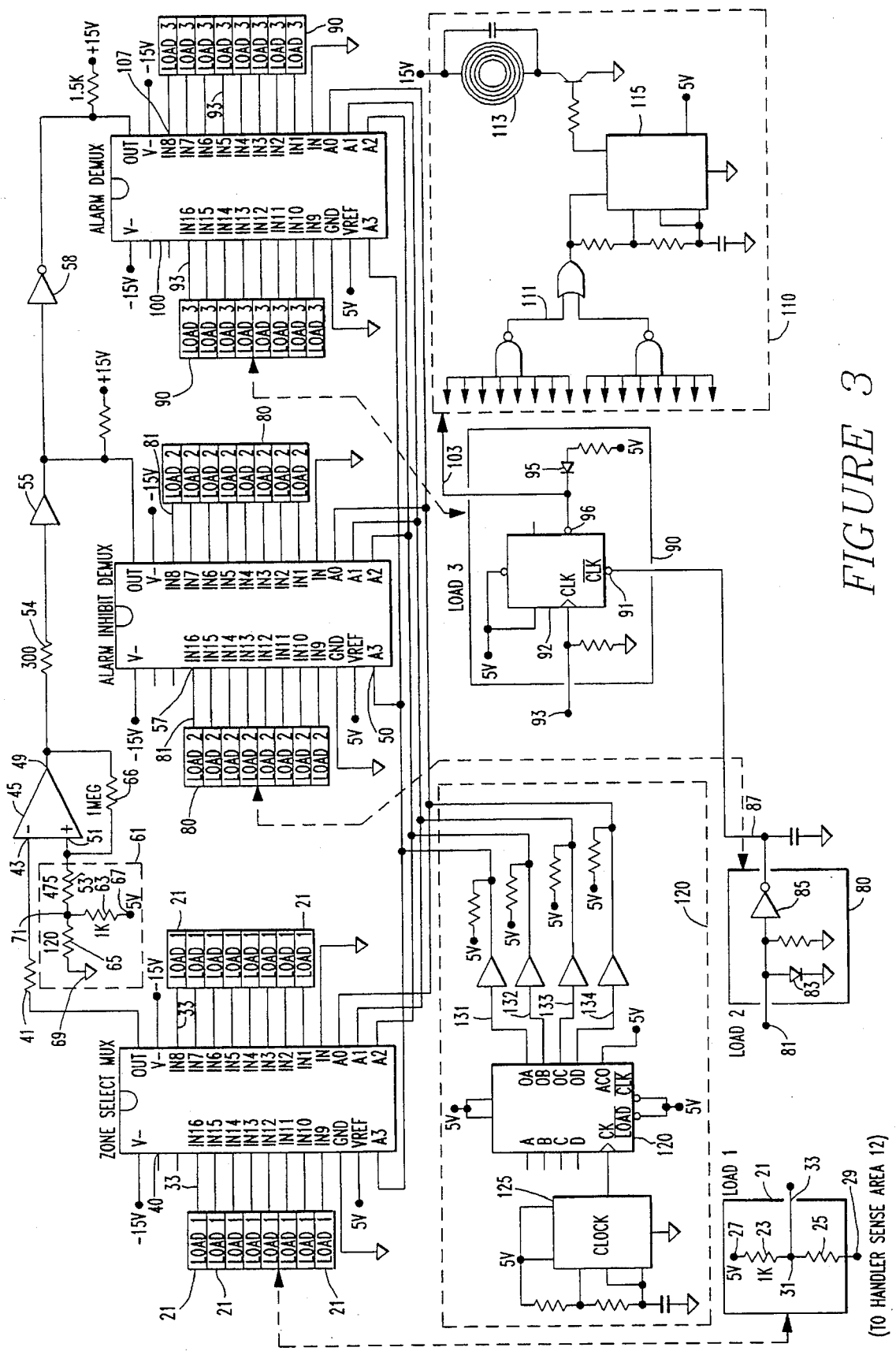

Referring now to FIGS. 2 and 3, there are respectively shown a block diagram and a more detailed circuit diagram of the resistance monitoring circuit arrangement of the present invention. As pointed out briefly above, the present invention is operative to effectively continuously monitor the integrity of plural locations along a ground potential connection to the travel path, and provides an output signal (both a visual display and an audible alarm) in the event of a prescribed degradation in ground potential at any of these monitored locations along the travel path.

More particularly, the circuit arrangement according to the present invention is shown as comprising a plurality or bank of resistance measurement devices 21 that are coupled to plural locations along the part's travel path through the handler. As a non-limitative example, sixteen measurement devices are shown. Each resistance measurement device 21 may comprise a voltage divider circuit containing a one kilohm resistor 23 and a one hundred ohm resistor 25 connected in series between a (five volt) reference node 27 and an input terminal 29, to which a respective measurement location (one of sixteen in the present example) within the handler is connected. The junction 31 between resistors 23 and 25 is coupled via a link 33 to a respective one of a plurality (e.g. sixteen) of input terminals or pins of a ZONE SELECT multiplexer 40.

ZONE SELECT multiplexer 40 is operative, under the control of a scan control unit 120, to sequentially couple links 33 from each of the (sixteen) voltage divider circuits 21 through a first input resistor 41 to a first (−) input 43 of a comparator circuit 45. A second (+) input 51 of comparator circuit 45 is coupled through a second input resistor 53 to a junction 71 of a resistance reference circuit 61. Like voltage divider 21, resistance reference circuit 61 may comprise a voltage divider circuit, here containing a one kilohm resistor 63 and a one hundred-twenty ohm resistor 65 connected in series between a (five volt) reference node 67 and a ground reference node 69. Comparator circuit 45 further includes a feedback resistor 66 connected between its output node 49 and its second input node 51.

The output of comparator 45 is coupled (through resistor 54 and driver 55) to an ALARM INHIBIT demultiplexer 50. ALARM INHIBIT demultiplexer 50 has a plurality (e.g. sixteen in the present example) of outputs 57, which are coupled to input nodes 81 of respective 'PASS' LED circuits 80. Each PASS LED circuit 80 contains a green light emitting diode 83 coupled between input node 81 and reference potential terminal (e.g. ground, as shown). An associated driver circuit 85 is coupled to an output link 87 for application to the CLEAR input 91 of a ALARM latch or flip-flop 92 contained within an ALARM indicator circuit 90.

The output of comparator 45 is further coupled (through driver 58) to an ALARM demultiplexer 100. ALARM demultiplexer 100 also has a plurality (e.g. sixteen in the present example) of outputs 107, which are coupled to input nodes 93 of respective ALARM indicator circuits 90. Each ALARM indicator circuit 90 contains a red light emitting diode 95, which is coupled to the QBAR output 96 of flip-flop 92, the clock input of which is coupled to input node 93. The D input of flip-flop 92 is tied to +5 v. The QBAR output 96 of flip-flop 92 is further coupled through link 103 to one input of a NAND-OR circuit 111 within an audio alarm circuit 110. Audio alarm circuit 110 further includes an audible acoustic generator device 113, which is coupled to a driver 115, driven by the output of NAND-OR circuit 111. Whenever any ALARM indicator circuit 90 produces an output to energize its associated red LED, the signal is also applied to NAND-OR circuit 111 to drive acoustic generator device 113 and thereby provide an audible indication of the detection of a ground fault.

Multiplexer 40 and demultiplexers 50 and 100 are scanned together by a scanning unit 120. Scanning unit 120 comprises a clock driven counter 123, respective outputs of which are coupled over driver links 131–134 to the control or steering inputs of the multiplexer and demultiplexer units. Thus, as counter 123 is sequentially clocked by the output of a clock driver 125, its outputs successively cycle each of the (sixteen) outputs/inputs of the multiplexer and demultiplexer units, so that each of the measurement locations within the handler is periodically scanned. Namely, as scanner unit 120 is sequentially clocked, it scans the voltage divider inputs to multiplexer 40 and applies their outputs to comparator 45, so that comparator 45 may sequentially compare the output of each of the resistance measurement circuits 21 on link 33 with a prescribed reference resistance value provided by reference resistor circuit 61. In the illustrated embodiment the difference between voltage resistors 25 and 65 provides a reference resistance value on the order of twenty ohms. If the output on link 33 from a respective resistance measurement device 21 indicates an effective resistance in excess of the prescribed reference value, the output of comparator 45 changes state, causing 'ground fault' signal to be generated at its output node 49. The generation of a ground fault signal at output node 49 in turn is applied (via inverter 58) to ALARM demultiplexer 100 and the complement of the output of inverter 58 is coupled to ALARM INHIBIT demultiplexer 50. As a consequence, a LOW is applied to input node 81 of 'PASS' LED circuit 80, while a HIGH is applied to input node 93 of ALARM indicator circuit 90. LED 83 therefore remains de-energized, while the QBAR output 96 of flip-flop 92 is latched LOW, thereby energizing LED 95 and acoustic generator device 113, and alerting processing personnel of the need to take the parts handler out of service for repair/corrective action.

Since LED 95 is latched ON, service personnel can see where, along the travel path within in the handler, the ground fault has been detected. Namely, in the course of the scan of the zone select multiplexer inputs to comparator 45, at respective measurement locations where a ground anomaly (too high a resistance) has been detected, comparator 45 is operative to cause an associated red LED 95 to be turned on (and maintained on by flip-flop 92 until reset).

If, on the other hand, the ground integrity of a respective scanned location is intact, the output of comparator 45 causes a HIGH input to be applied via ALARM INHIBIT demultiplexer 50 to input node 81 of PASS LED circuit 80. Inverter 58 applies a LOW to demultiplexer 100, so that a LOW is applied to input node 93 of flip-flop 92 within ALARM indicator circuit 90. The HIGH on input node 81 of PASS LED circuit 80 is coupled as a LOW on link 87 to the CLEAR input 91 of latch 92, keeping latch 92 from being clocked and thereby keeping the QBAR output 96 high, so that no alarm signal (audible or visible) is generated. Thus, as pointed out previously, when the scanned resistance location is within tolerance, the signal used to turn on the green (PASS) LED 83 is also used to inhibit the turn-on of its associated red (ALARM) light 95.

As will be appreciated from the foregoing description, the above-described grounding anomaly problem that exists in electronic circuit component test equipment is successfully addressed by the resistance monitoring circuit arrangement of the present invention, which effectively continuously monitors the integrity of a ground potential connection to the travel path, and provides an output signal (both a visual display and an audible alarm) in the event of a prescribed degradation in ground potential at any of a plurality of monitored locations along the travel path. Since each of a plurality of resistance monitoring circuits is repeatedly compared with a prescribed reference resistance value, the circuit arrangement of the invention is able to provide both an audible alarm that alerts processing personnel of the need to take the parts handler out of service for repair/corrective action, and a visual indication of where along the travel path within in the handler, the defect has been detected.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. For use with an electronic component handling apparatus through which an electronic component travels in the course of being processed, said handling apparatus having a travel path that is coupled to a prescribed potential to prevent the occurrence of an electrical discharge between said handler and said electronic component and thereby prevent electrical discharge damage of said component, a method of monitoring the ability of said handling apparatus to maintain said travel path coupled to said prescribed potential and thereby protect said electronic component against a potentially damaging electrical discharge comprising the steps of:

(a) monitoring a prescribed electrical characteristic of said handling apparatus at plurality of locations along said travel path;

(b) determining whether or not the prescribed electrical characteristic of a respective location monitored in step (a) satisfies a prescribed criterion; and (c) in response to the prescribed electrical characteristic monitored in step (a) failing to satisfy said prescribed criterion, generating a first output signal, and wherein step (a) comprises measuring the effective resistance of an electrical path coupling said prescribed potential to respective ones of said plurality of locations along said travel path, step (b) comprises determining whether or not said effective resistance is no greater than a prescribed reference resistance value, and step (c) comprises, in response to said effective resistance exceeding said prescribed reference resistance value, generating said first output signal and, in response to said effective resistance being no greater than said prescribed reference resistance value, generating a second output signal.

2. A method according to claim 1, wherein step (c) comprises, for a respective one of said plurality of locations, in response to said effective resistance being no greater than said prescribed reference resistance value, generating said second output signal and preventing the generation of said first output signal.

3. A method according to claim 1, wherein step (c) comprises generating said second output signal as an intermittent signal.

4. A method according to claim 1, wherein step (c) comprises generating said first output signal as a steady state signal.

5. A method according to claim 1, wherein step (c) comprises generating said second output signal as an intermittent light signal.

6. For use with an electronic component handling apparatus through which an electronic component travels in the course of being processed, said handling apparatus having a travel path that is coupled to a prescribed potential to prevent the occurrence of an electrical discharge between said handler and said electronic component and thereby prevent electrical discharge damage of said component, a method of monitoring the ability of said handling apparatus to maintain said travel path coupled to said prescribed potential and thereby protect said electronic component against a potentially damaging electrical discharge comprising the steps of:

(a) monitoring a prescribed electrical characteristic of said handling apparatus at plurality of locations along said travel path;

(b) determining whether or not the prescribed electrical characteristic of a respective location monitored in step (a) satisfies a prescribed criterion; and (c) in response to the prescribed electrical characteristic monitored in step (a) failing to satisfy said prescribed criterion, generating a first output signal, and wherein step (a) comprises measuring the effective resistance of an electrical path coupling said prescribed potential to respective ones of said plurality of locations along said travel path, step (b) comprises determining whether or not said effective resistance is no greater than a prescribed reference resistance value, and step (c) comprises, in response to said effective resistance exceeding said prescribed reference resistance value, generating said first output signal as an audible alarm signal.

7. For use with an electronic component handling apparatus through which an electronic component travels in the course of being processed, said handling apparatus having a travel path that is coupled to a prescribed potential to prevent the occurrence of an electrical discharge between said handler and said electronic component and thereby prevent electrical discharge damage of said component, a circuit arrangement for monitoring the ability of said handling apparatus to maintain said travel path coupled to said prescribed potential and thereby protect said electronic component against a potentially damaging electrical discharge comprising:

a first plurality of signalling devices, respective ones of which are associated with plural locations along said travel path;

a plurality of measurement devices coupled to said respective ones of said plural locations along said travel path and being operative to monitor the effective resistance of electrical paths coupling said locations to said prescribed potential; and a comparator unit which is operative to compare outputs of said plurality of measurement devices with a prescribed reference resistance criterion and, in response to the output of a respective measurement device being representative of a resistance in excess of said prescribed reference resistance criterion, causing an associated one of said first plurality of signalling devices to generate a first output signal.

8. A circuit arrangement according to claim 7, further including a second plurality of signalling devices, respective ones of which are associated with said plural locations along said travel path, and wherein said comparator unit is operative to cause an associated one of said second plurality of signalling devices to generate a second output signal in response to the output of a respective measurement device being representative of a resistance no greater than said prescribed reference resistance criterion.

9. A circuit arrangement according to claim 8, wherein said comparator unit is operative to prevent said associated one of said first plurality of signalling devices from generating said first output signal in response to the output of said respective measurement device being representative of a resistance no greater than said prescribed reference resistance criterion.

10. A circuit arrangement according to claim 9, further including a scanner unit which is operative to sequentially couple said plurality of measurement devices to said comparator unit, so that said comparator unit may sequentially compare outputs of said plurality of measurement devices with said prescribed reference resistance criterion.

11. A circuit arrangement according to claim 10, wherein said scanner unit is operative to couple a respective one of said plurality of measurement devices to said comparator unit for a prescribed period of time and, in response to the output of said respective measurement device being representative of a resistance no greater than said prescribed reference resistance criterion, is operative to cause the output of said comparator unit to enable a respective second signalling device to generate said second signal only during said prescribed period of time.

12. A circuit arrangement according to claim 8, wherein a respective second signalling device is operative to generate said second output signal as an intermittent signal.

13. A circuit arrangement according to claim 12, wherein a respective second signalling device is operative to generate said second output signal as an intermittent light signal.

14. A circuit arrangement according to claim 7, wherein a respective first signalling device is operative to generate said first output signal as a steady state signal.

15. A circuit arrangement according to claim 14, further including an audible alarm signalling device which is operative to generate an audible alarm signal in response to said first output signal.

16. A resistance monitoring circuit arrangement for use with an electronic component handling apparatus having a travel path by way of which an electronic component travels in the course of being subjected to measurement and test operations conducted by said handling apparatus, said travel path being coupled to ground potential so as to prevent the build-up of electrostatic charge upon said travel path and thereby prevent the occurrence of a potentially damaging electrical discharge between said handler and said electronic component, said circuit arrangement being operative to monitor the integrity of ground potential coupling to said travel path for the protection of said electronic component against said potentially damaging electrical discharge comprising:

an audible alarm unit;

a plurality of measurement devices coupled to said respective ones of plural locations along said travel path and being operative to monitor the effective resistance to ground potential of each of said plural locations;

a comparator unit which is operative to compare outputs of said plurality of measurement devices with a prescribed reference resistance criterion and, in response to the output of a respective measurement device being representative of an effective resistance in excess of said prescribed reference resistance criterion, being operative to cause an audible alarm to be generated by said audible alarm unit.

17. A resistance monitoring circuit arrangement according to claim 16, further including first and second pluralities of signalling devices, respective ones of which are associated with said plural locations along said travel path, and wherein said comparator unit is operative to cause an associated one of said first plurality of signalling devices to generate a first output signal in response to the output of a respective measurement device being representative of a resistance in excess of said prescribed reference resistance criterion, and being operative to cause a respective one of said second plurality of signalling devices to generate a second output signal in response to the output of a respective measurement device being representative of a resistance no greater than said prescribed reference resistance criterion.

* * * * *